United States Patent [19]
Quoirin et al.

[11] Patent Number: 5,903,028
[45] Date of Patent: May 11, 1999

[54] STATIC AND MONOLITHIC CURRENT LIMITER AND CIRCUIT-BREAKER

[75] Inventors: Jean-Baptiste Quoirin, Tours; Jean-Louis Sanchez, Escalquens; Jean Jallade, Castanet Tolosan, all of France

[73] Assignee: SGS-Thomson Microelectronics S.A., Saint Genis, France

[21] Appl. No.: 08/769,684

[22] Filed: Dec. 18, 1996

[30]    Foreign Application Priority Data

Dec. 20, 1995  [FR]  France .................................. 95 15508

[51] Int. Cl.⁶ ...................................................... H01L 23/62
[52] U.S. Cl. ........................... 257/328; 257/355; 257/358; 257/356; 257/360; 257/361; 307/31; 307/35; 307/51; 327/320; 327/321; 327/325; 327/327; 327/328; 327/180; 327/380; 327/381
[58] Field of Search ..................... 257/328, 329, 257/355, 360, 358; 327/321, 325, 327, 180, 380, 381, 328, 320; 307/31, 35, 51

[56]    References Cited

U.S. PATENT DOCUMENTS 5,272,399  12/1993  Tihanyi et al. ........................ 307/572
5,378,941  1/1995  Nishio et al. ............................ 257/355

FOREIGN PATENT DOCUMENTS

| A-24 60 422 | 6/1976 | Germany ........................ H02H 9/02 |
| 403097269 | 4/1991 | Japan ..................................... 257/328 |
| 404316369 | 11/1992 | Japan ..................................... 257/360 |
| 405114700 | 5/1993 | Japan ..................................... 257/360 |
| 406151866 | 5/1994 | Japan ..................................... 257/328 |
| WO-A-95 07548 | 3/1995 | WIPO ........................... H01L 29/86 |

OTHER PUBLICATIONS

French Search Report from French Patent Application 95 15508, filed Dec. 20, 1995.

*Primary Examiner*—Tom Thomas
*Assistant Examiner*—Fetsum Abraham
*Attorney, Agent, or Firm*—Wolf, Greenfield & Sacks, P.C.

[57]    ABSTRACT

The present invention relates to a static and monolithic current limiter and circuit-breaker component including, between two terminals, a one-way conduction current limiter, a sensor of the voltage between the terminals, and a mechanism for inhibiting the conduction of the current limiter when the voltage sensed exceeds a given threshold.

21 Claims, 6 Drawing Sheets

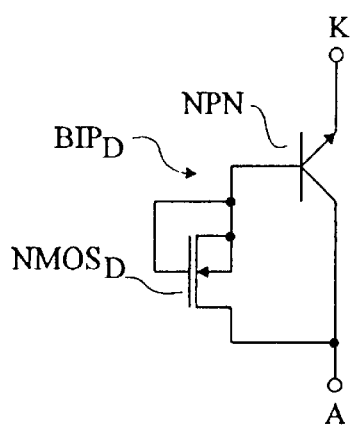
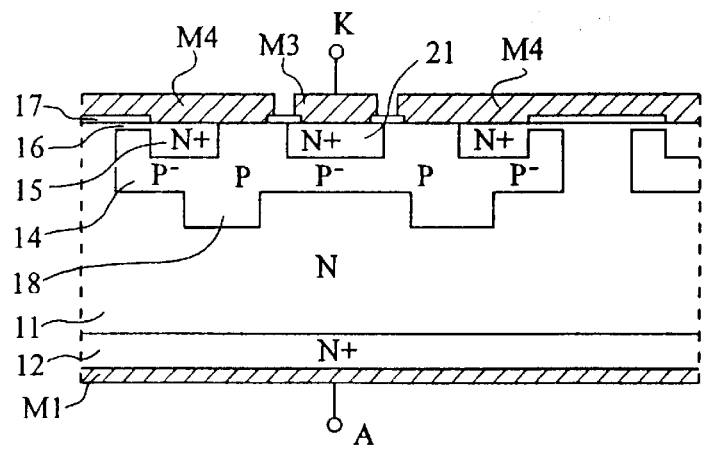
Fig 5A  Fig 5B
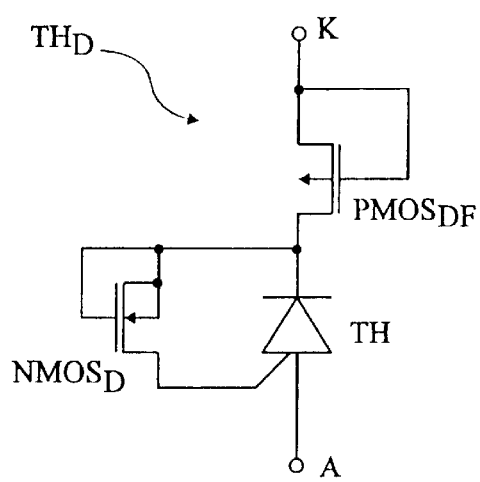
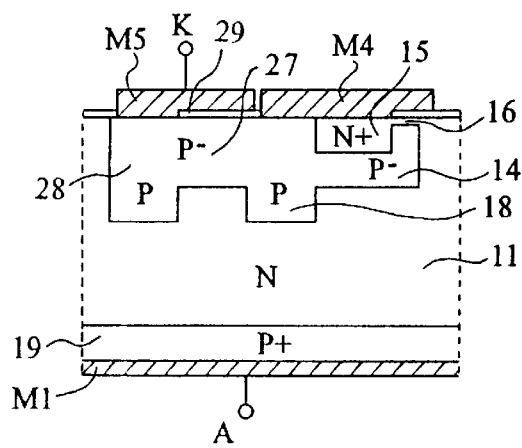
Fig 6A  Fig 6B

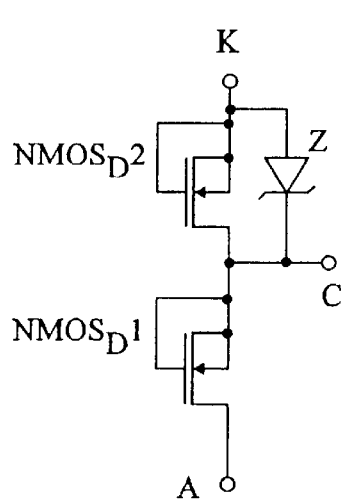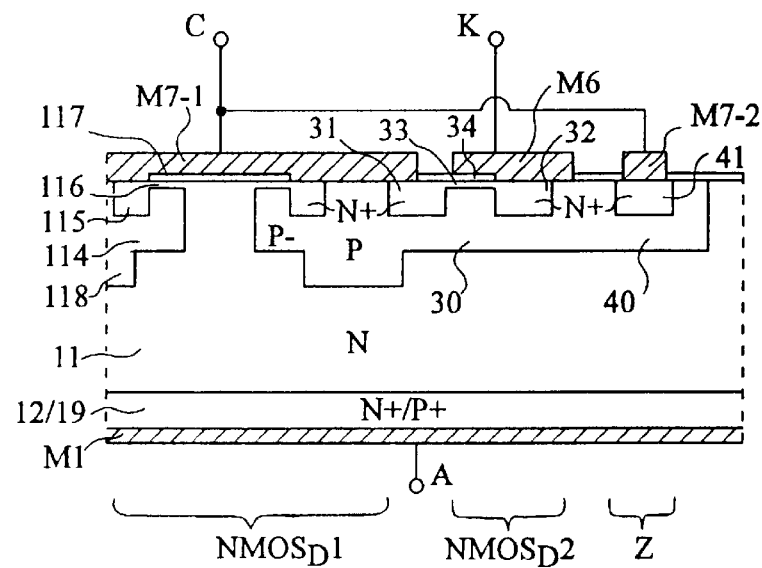
Fig 7A  Fig 7B
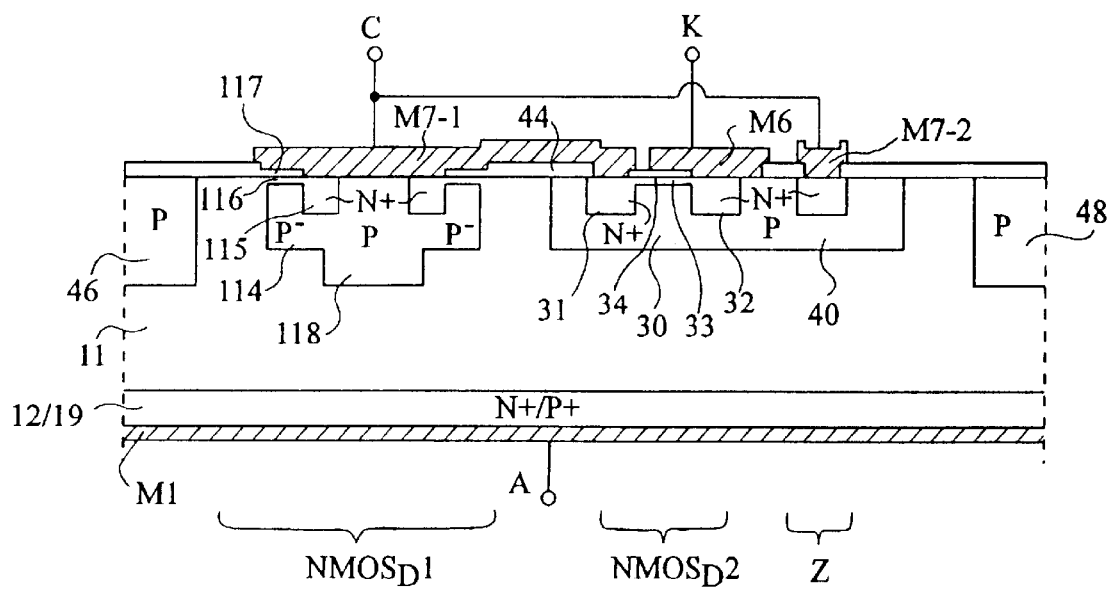
Fig 7C

STATIC AND MONOLITHIC CURRENT LIMITER AND CIRCUIT-BREAKER

BACKGROUND OF THE INVENTION

1. Field of the Invention

The present invention relates to the field of semiconductor components and more specifically to medium or high power components.

2. Discussion of the Related Art

In this field, components are known which are to be connected in series with a load and have the function of limiting the current in this load to a predetermined maximum value. For this purpose, a depletion MOS transistor with its gate connected to its source is for example used.

Components acting as circuit-breakers are also known.

SUMMARY OF THE INVENTION

An object of the present invention is to provide a new type of static and monolithic component which acts as both a current limiter and a circuit-breaker. Such a component lets a current with a limited value run through it as long as the voltage across it does not exceed a selected trigger threshold, then interrupts the current running through it when the voltage across it exceeds this threshold.

Another object of the present invention is to implement such a component which is self-restarting, that is, which functions as a current limiter again as soon as the voltage across it falls bellow a selected restarting threshold.

To achieve these objects, the present invention provides a static and monolithic current limiter and circuit-breaker component including, between two terminals, a one-way conduction current limiter and a sensor of the voltage between the two terminals. The component further includes inhibition means for inhibiting the conduction of the current limiter when the voltage sensed exceeds a selected threshold.

According to an embodiment of the present invention, the voltage sensor is a voltage divider.

According to an embodiment of the present invention, the voltage divider includes two N-channel MOS depletion transistors connected in series between the terminals.

According to an embodiment of the present invention, the inhibition means is a static switch in series with the current limiter.

According to an embodiment of the present invention, the current limiter is a vertical-type N-channel MOS depletion transistor.

According to an embodiment of the present invention, the current limiter is a vertical IGBT-type depletion transistor.

According to an embodiment of the present invention, the current limiter is a bipolar NPN transistor having its collector connected to its base via an N-channel MOS depletion transistor.

According to an embodiment of the present invention, the current limiter includes a vertical thyristor, a lateral floating-substrate P-channel MOS depletion transistor having its drain connected to the cathode of the vertical thyristor, and an N-channel MOS depletion transistor being placed between the cathode and the anode gate of the thyristor.

According to an embodiment of the present invention, the divider includes a first vertical N-channel MOS depletion transistor and a second lateral N-channel MOS depletion transistor.

These objects, features and advantages, as well as others, of the present invention will be discussed in detail in the following description of specific embodiments, taken in conjunction with the following drawings, but not limited by them.

BRIEF DESCRIPTION OF THE DRAWINGS

FIGS. 5A and 5B respectively are a symbolic representation and a schematic cross-sectional view of another suitable current limiter according to the present invention;

FIGS. 6A and 6B respectively are a symbolic representation and a schematic cross-sectional view of another suitable current limiter according to the present invention;

FIG. 7A is a symbolic representation of a suitable voltage divider according to the present invention, and FIGS. 7B and 7C are schematic cross-sectional views of suitable structures for the voltage divider of FIG. 7A;

DETAILED DESCRIPTION

Figure 1:
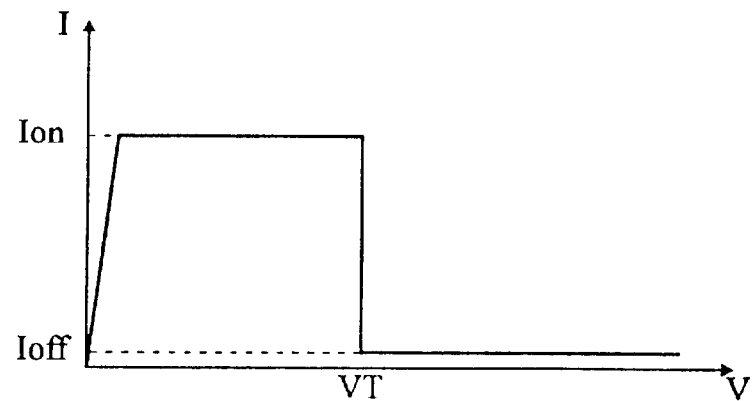
FIG. 1 shows the current/voltage characteristic of a device according to the present invention.

Generally, as is conventional, the cross-sectional views of semiconductor components in the drawings are not drawn to scale, neither within a given figure, nor from one figure to another. Those skilled in the art will refer to their general knowledge to determine the thicknesses and the doping levels of the various layers. The surfaces occupied by the various layers or the number of cells constituting a primary component will, as is known, be selected according to the technology used and the power dissipation imperatives.

The present invention aims at implementing a static and monolithic component having the current/voltage characteristic illustrated in FIG. 1.

As long as the voltage is lower than a threshold voltage VT, the current flowing through the component is limited to a substantially constant value Ion. As soon as the voltage across the components exceeds value VT, the current falls to a value Ioff which is low with respect to Ion, wherefrom there results a substantial interruption of the current in the circuit including the component.

Figure 2A:
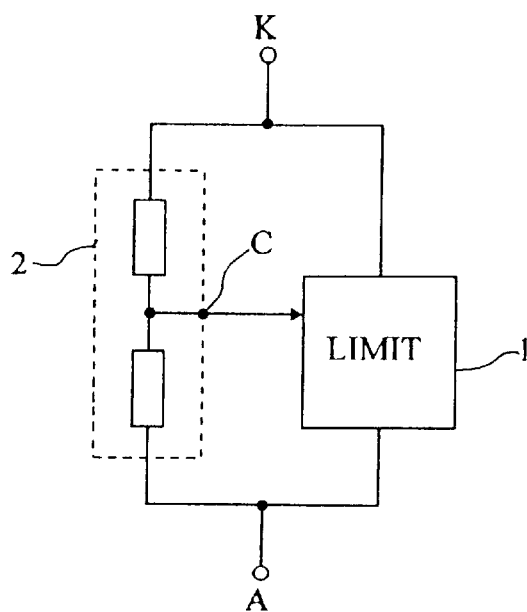
FIG. 2A is a block diagram illustrating the main components of a device according to a first embodiment of the invention.

FIG. 2A shows in the form of a block diagram the overall structure of a component according to a first embodiment of the present invention. This component connects between terminals A and K, the terminal A or anode terminal being positive with respect to the terminal K or cathode terminal.

The component includes, between these terminals, a current limiter 1 and a voltage detector 2. The voltage detector (or sensor) is, for example, a voltage divider which supplies a terminal C with a control voltage VC as the voltage between terminals A and K reaches threshold value VT. Voltage VC controls current limiter 1 to inhibit its operation, that is, to block it.

Figure 2B:
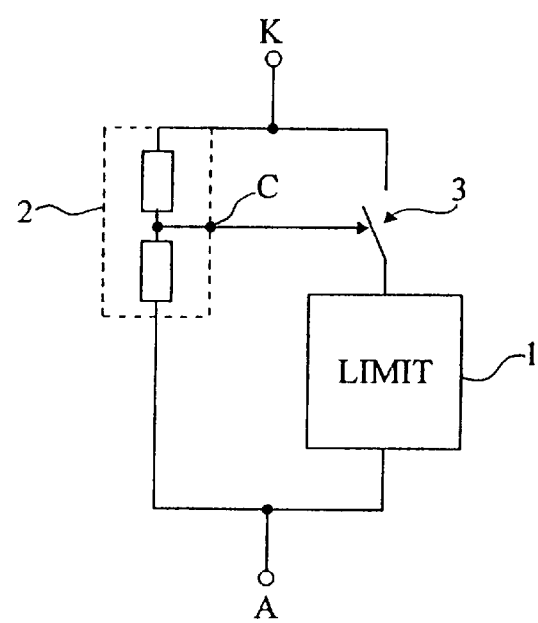
FIG. 2B is a block diagram illustrating the main components of a device according to a second embodiment of the invention.

In a second embodiment of the present invention illustrated in FIG. 2B, the voltage detector causes the opening of a switch 3, in series with limiter 1, as the voltage between terminals A and K reaches value VT.

CURRENT LIMITER

FIGS. 3 to 6 show various possible embodiments of a current limiter that are suitable for the present invention. Each embodiment may be integrated as one block with the other elements of the component according to the invention. Notably, this limiter is of a vertical type and includes a first electrode on a first main surface of the component and a second electrode on a second main surface of the component.

Figure 3A:
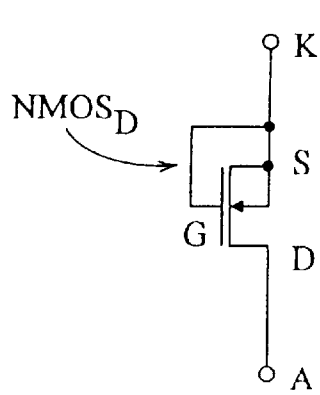
FIGS. 3A and 3B respectively are a symbolic representation and a schematic cross-sectional view of a suitable current limiter according to the present invention.

The current limiter of FIG. 3A is an N-channel MOS depletion transistor ($NMOS_D$) having its gate connected to its source.

Figure 3B:
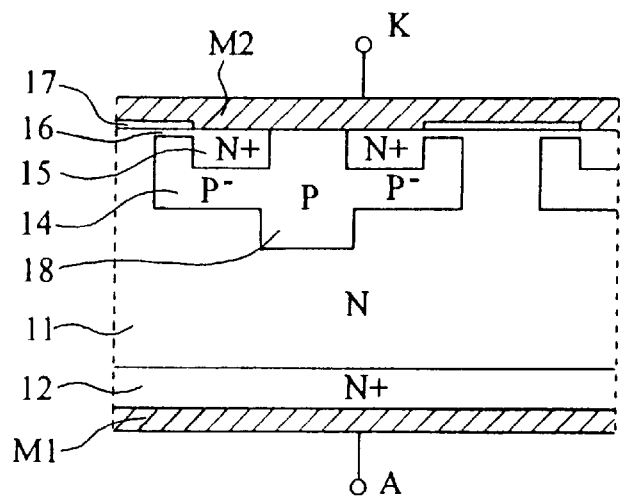

FIG. 3B shows a simplified schematic cross-sectional view of an example of an embodiment of such a component.

This component is formed into an N-type silicon layer 11 with a low doping level including on its rear surface side a highly-doped N-type layer 12 enabling the making of an ohmic contact with an anode metallization M1 covering the rear surface. Transistor $NMOS_D$ is implemented in a vertical form to enable significant power dissipation. It includes one or more cells, each of which is formed in a lightly-doped P-type well 14 having, for example, an hexagonal or square shape in plane view. On the upper surface side of well 14 is formed an $N^+$-type region 15 with substantially the shape of ring. The upper part of well 14 between the outer circumference of ring 15 and the outer circumference of well 14 is occupied by a lightly-doped N-type region 16 coated by a gate insulator 17. The central portion of well 14 generally corresponds to a more highly-doped P-type region 18. The upper surface of the component is coated with a cathode metallization M2.

Thus, as is known, the rear surface of the component corresponds to the drain of the MOS transistor, region 15 corresponds to its source, overdoped portion 18 corresponds to the contact of the substrate of the MOS transistor and region 16 corresponds to the channel region. Metallization M2 forms a gate contact above gate insulation region 17, a source contact above region 15 and a substract contact above region 18. A component having a function corresponding to the diagram of FIG. 3A is thus obtained.

This component is known in the art and is likely to have various alternative embodiments well known by those skilled in the art.

Figure 4A:
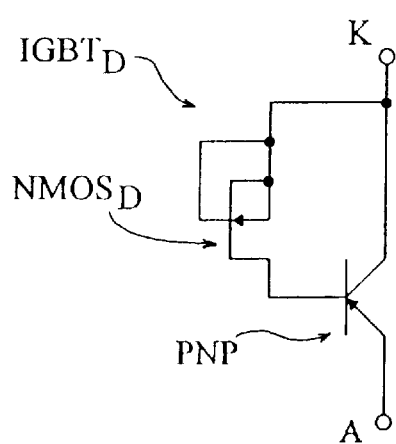
FIGS. 4A and 4B respectively are a symbolic representation and a schematic cross-sectional view of another suitable current limiter according to the present invention.
Figure 4B:
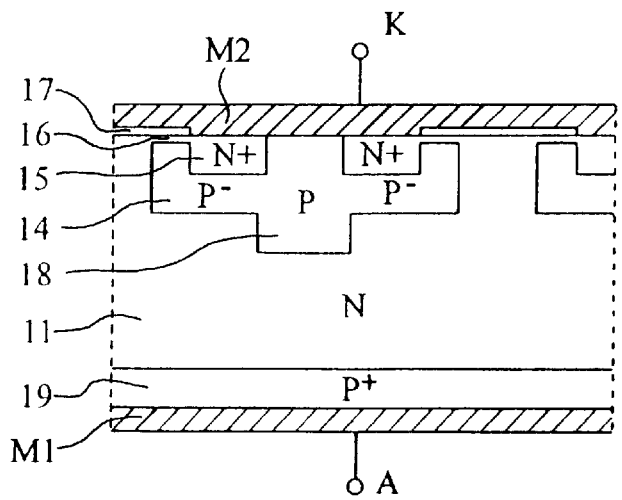

FIG. 4B shows an alternative embodiment of the component of FIG. 3B wherein the semiconductor highly-doped N-type rear surface layer 12 is replaced by a highly-doped P-type layer 19. A so-called depletion isolated-gate bipolar transistor ($IGBT_D$) is thus obtained, its equivalent diagram being illustrated in FIG. 4A. This component is equivalent to a PNP transistor, with its transmitter corresponding to layer 19, its base corresponding to lightly-doped region 11, and its collector corresponding to P regions 14, 18. A vertical N-channel MOS depletion transistor, identical to that of FIG. 3B, is connected through its source terminal to terminal K and through its drain terminal to the base of transistor PNP and thus ensures, by maintaining a constant base-collector current, the flowing of a constant current between the collector and transmitter of the PNP transistor.

In the diagram of FIG. 5A, a component is provided as a current limiter, which includes between terminals A and K a component $BIP_D$ including, between terminals A and K, an NPN-type bipolar transistor having its collector connected to terminal A and its transmitter to terminal K. The base of this NPN transistor is connected to its collector via a transistor $NMOS_D$ such as previously described. The maintaining of a constant collector-base current in this NPN transistor under the effect of transistor $NMOS_D$ ensures the maintaining of a constant current between the collector and transmitter. It should be noted that the provision of such a component constitutes an aspect of the present invention.

An example of implementation of the component of FIG. 5A is illustrated in the schematic cross-sectional view of FIG. 5B. The same parts as in FIG. 3B are found in this component, referred to by the same reference numerals, to constitute a vertical N-channel MOS depletion transistor notably including the regions and layers referred to by reference numerals 11–12 and 14–18. Again, the rear surface is coated with a uniform anode metallization M1. A specific character of the structure of FIG. 5B is that the central portion, internal to $N^+$-type region 15, is occupied by a strongly-doped N-type region 21. This region 21 is formed into a portion with a low level of doping of well 14 and is coated with a metallization M3 connected to cathode K. A metallization M4 forms the gate, source and well contact metallization of transistor $NMOS_D$. This metallization M4, by its contact with well region 18, forms the base connection of the NPN transistor. This NPN transistor has region 21 as a transmitter, region 18 as a base and regions 11, 12 as a collector.

This implementation is likely to have various variants which will be apparent to those skilled in the art. Notably, the doping of P region 18 should be optimized to optimize the gain of the NPN transistor. In an alternative embodiment, the base well of the NPN transistor may be separated from the well of transistor $NMOS_D$. Then, these wells will be connected by a metallization. Such an embodiment will be described hereafter in relation with FIG. 9A, and has the advantage of enabling to optimize the doping levels of the wells according to the characteristics of the NPN transistor and of transistor $NMOS_D$ which are searched.

FIG. 6A shows the diagram of a structure $TH_D$ wherein the current limiter component is a P-channel MOS depletion floating-substrate transistor $PMOS_{DF}$. Transistor $PMOS_{DF}$ is implemented in the form of a lateral MOS transistor. Thus, to ensure that the main electrodes of the current limiter are mounted on the opposite main surfaces of the component, this transistor $PMOS_{DF}$ is connected in series with a thyristor TH. The turning-on of thyristor TH is ensured by the series-connection of its cathode and of an anode-gate region via an N-channel MOS depletion transistor $NMOS_D$.

FIG. 6B shows an example of embodiment of the circuit of FIG. 6A. In the right portion of FIG. 6B, semiconductor regions similar to those described in the preceding drawings can be found. It should be noted that the rear surface semiconductor layer is a $P^+$-type layer 19, as in the case of FIG. 4B. Thus, layers and regions 15, 14, 11 and 19 altogether form a thyristor TH. $N^+$-region 15 forms, with channel region 16 and lightly-doped region 11, an NMOS depletion transistor. Metallization M4 corresponds to a gate-source connection of transistor $NMOS_D$, and to the cathode of thyristor TH. Metallization M4 extends over the more highly-doped P-type region 18. This structure includes, contiguous to region 18, a P⁻ region 31 and a P region 32. P⁻ region 31 is topped by a gate insulation region 33. A metallization M5 is in contact with region 32 and extends over gate insulation region 33. Thus, regions 18, 31 and 32 form a MOS depletion transistor, the substrate of which corresponds to N region 11. This substrate, which is not connected to the transistor source, is floating. A P-channel MOS depletion floating-substrate transistor $PMOS_{DF}$ has thus been obtained. Source-gate metallization M5 is connected to terminal K. The drain metallization is formed by metallization M4. The structure of FIG. 6B thus corresponds to the structure of FIG. 6A, terminal K being formed on the upper surface and terminal A on the lower surface. Thus, the function of thyristor TH is to transfer to the rear surface the drain metallization of transistor $PMOS_{DF}$, and the function of transistor $NMOS_D$ is to turn on this thyristor.

VOLTAGE SENSOR

FIG. 7A shows an example of a voltage sensor which can be used in a component according to an embodiment of the present invention. This voltage sensor is formed by a voltage divider including two N-channel MOS depletion transistors connected in series and operating as resistors, that is, prior to arriving in their current limiting operation region. Each of these MOS transistors has its gate connected to its source. Terminal A is connected to the drain of a first transistor $NMOS_D1$ and terminal K to the source-gate of the second transistor $NMOS_D2$. Besides, a zener diode Z has been shown on the equivalent diagram, with its anode connected to terminal K and its cathode connected to the connecting point C of the two transistors.

FIG. 7B shows a first embodiment of the circuit of FIG. 7A.

The transistor $NMOS_D1$ shown in the left portion of the drawing is a vertical N-channel MOS depletion transistor having substantially the same structure as that shown in FIG. 3B. Reference numerals 114–118 have been used to refer to regions corresponding to those referred to by reference numerals 14–18 in FIG. 3B. It should be noted that, on the rear surface side of the component, an N⁺layer 12 or a P⁺layer 19 can be provided which will not substantially alter the operation of transistor $NMOS_D1$ since, if this rear surface layer is a P⁺-type layer 19, the P⁺N junction between layers 19 and 11 is forward biased, this rear surface being meant to be connected to an anode terminal A which is the most positive of the voltages applied to the component.

Transistor $NMOS_D2$ is formed in an extension 30 of the lightly-doped P-type well 114 or in a distinct P-type well in the form of a conventional lateral MOS transistor including an N⁺-type drain region 31 and an N⁺-type source region 32 separated by a preformed lightly-doped N-type channel region 33. The channel region is topped by a gate insulating layer 34.

Zener diode Z is formed in an extension 40 of well 114 or in a distinct well and includes, in the upper surface of this well, an N⁺-type region 41.

A metallization M6 corresponds to the source and to the gate of transistor $NMOS_D2$ and is connected to the cathode terminal K. A metallization M7-1 corresponds to the gate, to the source and to the well contact of transistor $NMOS_D1$ as well as to the drain of transistor $NMOS_D2$ and is connected to terminal C. A metallization M7-2 in contact with the cathode region 41 of zener diode Z is also connected to terminal C. It should be noted that the anode of zener diode Z, corresponding to well 40, is connected to terminal K via an extension of metallization M6 on well 40.

FIG. 7C shows a variant of FIG. 7B wherein wells 30, 40 have been separated from well 114, 118. Accordingly, metallization M7-1 joins the drain region 31 of transistor $NMOS_D2$ by passing over an insulating region 44.

In FIG. 7C, the insulating regions formed in the upper portion of the component have been shown, other than the gate insulating regions, as thicker as these gate insulating regions. This will correspond to practical implementations and has not been previously shown, for clarity. It should also be noted that, according to the manufacturing process used, more than two distinct insulating layers may be found at the upper surface of the component, some of these layers corresponding to what is generally called "thick oxide" in the context of MOS transistor manufacturing.

Also, in FIG. 7C, P-type wells 46 and 48 have been shown at the structure limits. These wells may be specifically provided to hold high voltage in the structure or may include other parts of a more complex component.

LIMITER-CIRCUIT-BREAKER

Figure 8A:
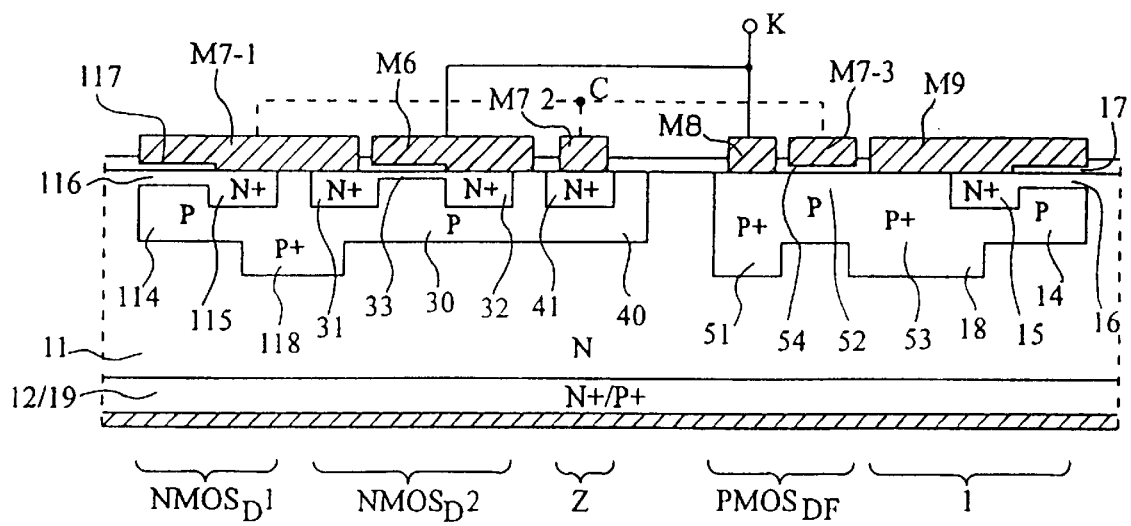
FIG. 8A is a schematic cross-sectional view of a limiter-circuit-breaker according to the second embodiment of the present invention, and, FIGS. 8B and 8C are equivalent symbolic representations of the limiter-circuit-breaker of FIG. 8A; according to the first embodiment of the present invention and, FIG. 9B is an equivalent symbolic representation circuit diagram of the limiter-circuit-breaker of FIG. 9A.

FIG. 8A is a schematic cross-sectional view of a limiter circuit-breaker component according to the second embodiment of the present invention. According to whether the rear surface layer of the component is of N⁺or P⁺type, the component corresponds to the equivalent diagram of FIG. 8B or of FIG. 8C.

Figures 8B, 8C:
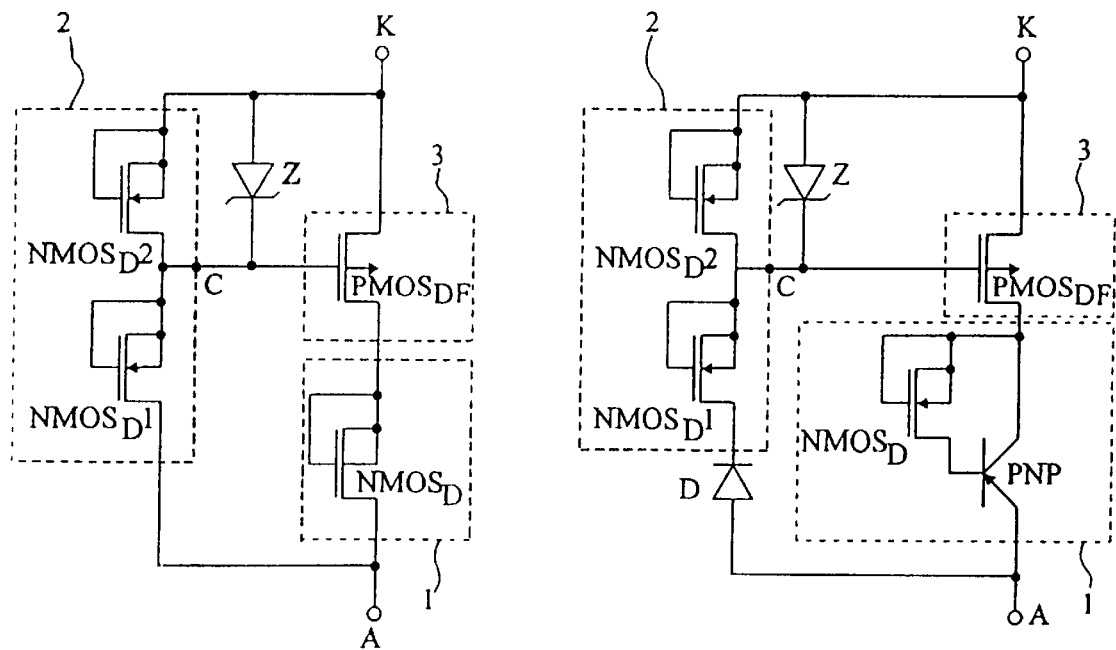

The diagrams of FIGS. 8B and 8C correspond to implementations of the general diagram of the present invention previously described in relation with FIG. 2B. Limiter 1 is implemented in the form of an N-channel MOS depletion transistor $NMOS_D$ with its gate and source interconnected in the case of FIG. 8B and in the form of a depletion IGBT transistor in the case of FIG. 8C. Voltage sensor 2 is implemented in the form of a divider including two N-channel MOS depletion transistors $NMOS_D1$ and $NMOS_D2$. Switch 3 is implemented in the form of a P-channel MOS depletion floating-substrate transistor $PMOS_{DF}$. A gate protection zener diode Z for transistor $PMOS_{DF}$ is shown in FIGS. 8B and 8C. Further, in FIG. 8C, a diode D can be found. It is not a component required for the operation of the circuit but a component inherent to its implementation which corresponds to the junction between a P⁺-type rear surface region 19 and N-type substrate 11. Clearly, this diode D does not disturb the operation since it is forward biased. It is all the less disturbing as there normally flows a very low current through the branch including divider 2. Its forward voltage drop will only have to be taken into account for determining the triggering threshold of switch 3.

Thus, FIG. 8A reproduces in its left portion the parts shown in FIG. 7B. Transistors $NMOS_D1$ and $NMOS_D2$ and diode Z are notably to be found therein. In the right portion of the drawing, the structure of FIG. 3B or that of FIG. 4B is to be found, according to whether the lower layer is of N⁺or P⁺type. These components, previously described, will not be described again. They are referred to by the same reference numerals in FIG. 8A as in the preceding drawings.

Switch 3 is implemented in the form of a lateral P-channel MOS depletion floating-substrate transistor $PMOS_{DF}$ including a highly-doped P-type drain region 51, a lightly-doped P-type preformed channel region 52 and a highly-doped P-type source region 53 which, in this embodiment, is common with region 18 of transistor $NMOS_D$.

On the portion corresponding to the voltage divider, the same metallizations M7-1, M6 and M7-2 as those described in relation with FIG. 7B are to be found.

In the right portion of FIG. 8A, a metallization M8 forms one piece with the drain region 51 of transistor $PMOS_{DF}$. Metallization M8 is also connected to cathode terminal K. A gate metallization M7-3 of transistor $PMOS_D$ is also connected to terminal C. A metallization M9 covers the P+drain region of transistor $PMOS_D$ and the well region of transistor $NMOS_D$ 53/18 as well as the source region of transistor $NMOS_D$ and the gate insulation region of transistor $NMOS_D$.

The operating mode of this component clearly results from the diagrams of FIGS. 8B and 8C. As long as the voltage on the midpoint C of voltage divider 2 is lower than the threshold voltage of transistor $PMOS_{DF}$, this transistor conducts and transistor $NMOS_D$ or the depletion IGBT limits the current to a value Ion which depends on their characteristics. As soon as the voltage on midpoint C exceeds the above-mentioned threshold voltage, transistor $PMOS_{DF}$ stops conducting and there only remains between terminals A and K a very low leakage current Ioff which corresponds to the current in divider 2.

Figure 9A:
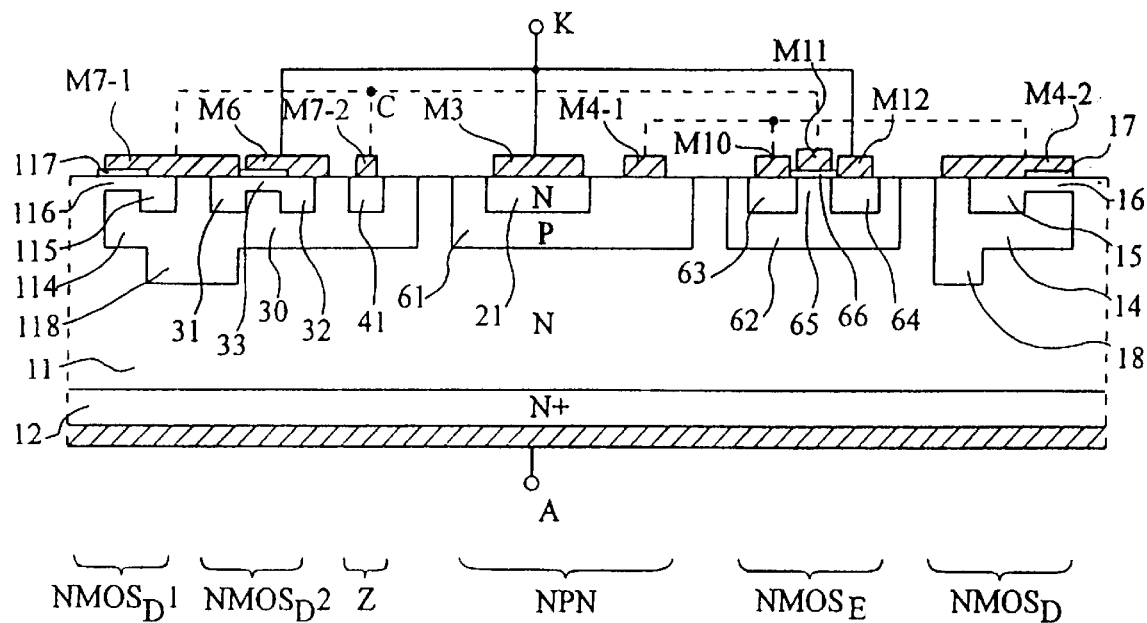
Figure 9B:
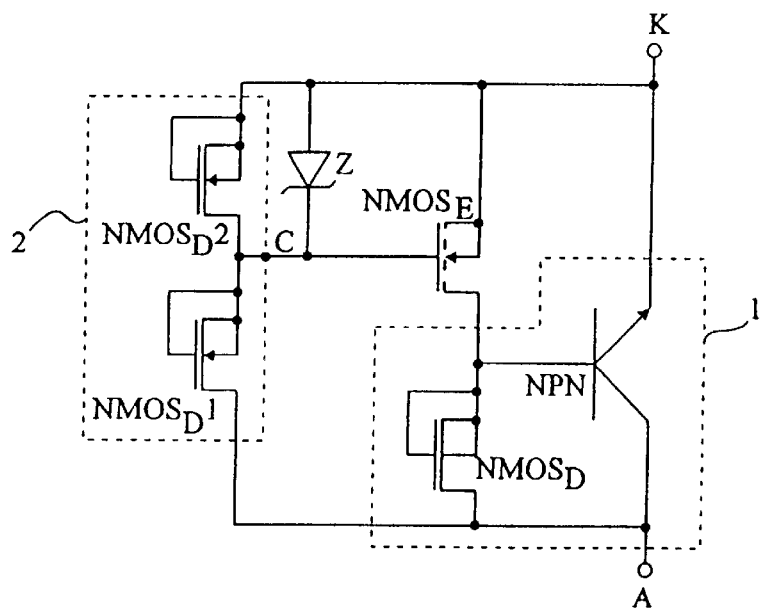

FIGS. 9A and 9B illustrate a schematic cross-sectional view and an equivalent diagram of a semiconductor component according to the first embodiment of the present invention. This embodiment uses a limiter of the type illustrated in FIGS. 5A and 5B. The general arrangement resembles that represented in the form of blocks in FIG. 2A. Limiter 1, including an NPN transistor and a transistor $NMOS_D$, is connected between terminals A and K. The base terminal of the bipolar transistor is connected to the cathode terminal via an N-channel MOS enhancement transistor $NMOS_E$ having its gate connected to the output terminal C of divider bridge 2.

These various components are structurally shown in FIG. 9A. The left portion of FIG. 9A which corresponds to divider bridge 2 is identical to the left portion of FIG. 8A and includes transistors $NMOS_D1$ and $NMOS_D2$ as well as zener diode Z. As for the right portion of the drawing, a variant has been introduced with respect to the representation of FIG. 5B, that is, transistors NPN and $NMOS_D$ are implemented in distinct wells. The NPN transistor appears in the center portion of the drawing. Its base well is referred to by reference numeral 61. Transistor $NMOS_D$ appears in the right portion of the drawing. Between the NPN transistor and transistor $NMOS_D$, an example of an implementation of enhancement transistor $NMOS_E$ has been shown, which is implemented in the form of a conventional lateral MOS transistor which includes, in a well 62, a drain region 63, a source region 64, and a channel region 65 topped by a gate insulating region 66.

The metallizations on the voltage divider region are identical to those of FIG. 8A and are referred to by the same reference numerals M6, M7-1, M7-2. As in FIG. 5B, the transmitter 21 of the NPN transistor is coated with a metallization M3 connected to terminal K. The base 61 of the NPN transistor forms one piece with a metallization M4-1 connected to a metallization M4-2 corresponding to the well/source/gate connection of transistor $NMOS_D$. The drain 63, the gate insulator 66 and the source 64 of transistor $NMOS_E$ respectively support metallizations M10, M11 and M12. Metallization M10 is connected to metallizations M4-1/M4-2; metallization M11 is connected to metallizations M7-1/M7-2; metallization M12 is connected to terminal K.

The operation of this component is the following. As soon as the voltage on terminal C is lower than the threshold voltage of transistor $NMOS_E$, this transistor is blocked and the NPN transistor ensures, by means of the connection between its base and its collector by transistor $NMOS_D$, the flowing of a constant limited current Ion between terminals A and K. As soon as the voltage on terminal C exceeds the threshold voltage of transistor $NMOS_E$, this transistor starts to conduct and short-circuits the base-transmitter junction of the NPN transistor, which blocks this latter transistor. Then, there only flows a current Ioff between terminals A and K, this current Ioff mostly corresponding to the current through divider bridge 2.

NUMERIC EXAMPLE

As an example only and without limiting the present invention, possible numeric values applicable to the structure schematically shown in FIG. 8A will be indicated hereafter.

This structure can be formed from an N-type silicon wafer in a plane <100> having a sheet resistance of 30 ohm.cm.

If the superficial concentration of a region is called Cs, and the junction depth is called xj, the following parameters can be chosen for the various regions.

|  | Cs (at/cm³) | xj (μm) |
|---|---|---|
| P+ regions (118, 51, 53) | $1.1 \times 10^{19}$ | 4.35 |
| P regions (14, 30, 40, 52, 114) | $3 \times 10^{16}$ | 2.5 |
| N+ regions (15, 31, 32, 41, 115) | $6 \times 10^{19}$ | 1.15 |
| N channels (16, 33, 116) | $4.5 \times 10^{17}$ |  |

The gate widths can be of around 50 nm. The horizontal dimensions of the wells are those currently chosen in the field of power MOS transistors, that is, from approximately 25 to 50 μm.

With such parameters, devices bearing voltages from 600 to 1500 V are obtained, the current Ion of which is from 1 to 5 A and the current Ioff of which is from 1 to 10 mA.

VARIANTS

Of course, as has already been indicated in this description, each of the parts described as examples is likely to have various variants and can be formed by one or more cells. The present invention is likely to have several variants and modifications, which will occur to those skilled in the art. The latter will essentially have to monolithically assemble the following parts.

A Current Limiter

The current must be able to dissipate a significant amount of power. It will preferably be a current limiter, the main current-conducting component of which is a component implemented in a vertical form. The four embodiments of current limiters previously described are only examples. Those skilled in the art can provide other current limiters performing the same function or variants of the current limiters described. For example, the bipolar transistors can be turned into Darlington circuits, and associations of MOS transistors can also be provided.

A Voltage Sensor

Only one voltage sensor of the MOS depletion transistor divider type has been described herein. Those skilled in the art will know how to chose the dimensions and on-state resistances of the transistors so that voltage VC reaches a selected value when voltage VAK reaches a predetermined value. Other dividers, of resistive type or with transistors, may be used. Further, other types of voltage sensors can be provided, to issue an indication which regularly increases until a predetermined value is reached, or to issue an output which varies binarily when a certain threshold is reached. Such a circuit can for instance be formed by a comparator receiving the output of a voltage divider of the type described.

A Switch

The switch may be integrated or not to the current limiter. The function of the switch is to bear the voltage in the non-conducting state.

Other current limiter, voltage sensor and switch associations can be provided, so long as they are compatible and can form a monolithic component.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalents thereto.

What is claimed is:

1. A static and monolithic current limiter and circuit-breaker component that connects between a first terminal and a second terminal, the component comprising:

a one-way conduction current limiter;

a voltage sensor that senses a voltage between the first and second terminals, wherein the voltage sensor is a voltage divider connected between the first and second terminals, wherein the voltage divider includes two N-channel MOS depletion transistors connected in series between the first and second terminals, wherein the current limiter is one of a vertical-type N-channel MOS depletion transistor and a vertical IGBT-type depletion transistor, wherein the inhibition means is a static switch in series with the current limiter, and wherein the switch is formed by a P-channel MOS depletion floating-substrate transistor; and means for inhibiting conduction of the current limiter when the voltage sensed exceeds a selected threshold.

2. The component of claim 1, wherein the voltage sensor is a voltage divider connected between the first and second terminals.

3. The component of claim 2, wherein the voltage divider includes two N-channel MOS depletion transistors connected in series between the first and second terminals.

4. The component of claim 3, wherein the two N-channel MOS depletion transistors of the divider includes a first vertical N-channel MOS depletion transistor, and a second lateral N-channel MOS depletion transistor.

5. The component of claim 1, wherein the means for inhibiting comprises a static switch coupled in series with the current limiter.

6. The component of claim 1, wherein the current limiter comprises a vertical-type N-channel MOS depletion transistor.

7. The component of claim 1, wherein the current limiter comprises a vertical IGBT-type depletion transistor.

8. The component of claim 1, wherein the current limiter includes:

an N-channel MOS depletion transistor; and a bipolar NPN transistor having a base, and a collector connected to the base via the N-channel MOS depletion transistor.

9. The component of claim 1, wherein the P-channel MOS depletion floating-substrate transistor includes a gate, wherein the component further includes a zener diode mounted in parallel with one of the two MOS depletion transistors of the voltage divider, and wherein the zener diode is connected between the most negative terminal of the first and second terminals and the gate of the P-channel MOS depletion floating-substrate transistor.

10. A limiter-circuit-breaker circuit that connects between a cathode terminal and an anode terminal, the limiter-circuit-breaker circuit comprising:

a voltage sensor that senses a voltage between the cathode and anode terminals, the voltage sensor having a first sensor terminal that connects to the cathode terminal, a second sensor terminal that connects to the anode terminal, and a sensor output that provides a control voltage; and a current limiter that provides a current path between the cathode and anode terminals when the control voltage is below a predetermined threshold, and blocks the current path between the cathode and anode terminals when the control voltage is above the predetermined threshold, the current limiter having a first limiter terminal that connects to the cathode terminal, a second limiter terminal that connects to the anode terminal, and an input connected to the output of the voltage sensor.

11. The limiter-circuit-breaker circuit of claim 10, wherein the voltage sensor includes a first resistive element and a second resistive element coupled in series, wherein the first resistive element is coupled between the cathode terminal and the output, and wherein the second resistive element is coupled between the anode terminal and the output.

12. The limiter-circuit-breaker circuit of claim 11, wherein one of the first and second resistive elements is a vertical MOS transistor, and the other of the first and second resistive elements is a lateral MOS transistor.

13. The limiter-circuit-breaker circuit of claim 10, wherein the current limiter includes a switch, and a limiting circuit; and wherein the voltage sensor, the switch and the limiting circuit are formed within a single integrated component.

14. The limiter-circuit-breaker circuit of claim 13, wherein the switch includes a MOS transistor having a channel of a first doping type, wherein the limiting circuit includes a MOS transistor having a channel of a second doping type, and wherein the first and second doping types are different.

15. A limiter-circuit-breaker circuit that connects between a cathode terminal and an anode terminal, the limiter-circuit-breaker circuit comprising:

voltage sensing means for sensing a voltage between the cathode and anode terminals, and providing a control voltage based on the voltage between the cathode and anode terminals; and current limiting means for providing a current path between the cathode and anode terminals when the control voltage is below a predetermined threshold, and blocking the current path between the cathode and anode terminals when the control voltage is above the predetermined threshold.

16. The limiter-circuit-breaker circuit of claim 15, wherein the voltage sensing means includes means for dividing the voltage between the cathode and anode terminals to generate the control voltage.

17. The limiter-circuit-breaker circuit of claim 16, wherein means for dividing includes an output that provides the control voltage; means for providing a first resistance between the cathode terminal and the output, and means for providing a second resistance between the anode terminal and the output.

18. The limiter-circuit-breaker circuit of claim 15, wherein the current limiting means includes a limiting circuit coupled between the anode and cathode terminals, and means for connecting and disconnecting the limiting circuit, coupled between the limiting circuit and one of the anode and cathode, in response to the control voltage.

19. The limiter-circuit-breaker circuit of claim 18, wherein the means for connecting includes a MOS transistor having a channel of a first doping type, wherein the limiting circuit includes a MOS transistor having a channel of a second doping type, and wherein the first and second doping type are different.

20. A static and monolithic current limiter and circuit-breaker component that connects between a first terminal and a second terminal, the component comprising:
 a one-way conduction current limiter including
  a vertical thyristor having a cathode and an anode gate,
  a lateral P-channel MOS depletion floating-substrate transistor having a drain connected to the cathode of the vertical thyristor, and
  an N-channel MOS depletion transistor placed between the cathode and the anode gate of the thyristor;
 a voltage sensor that senses a voltage between the first and second terminals; and
 means for inhibiting conduction of the current limiter when the voltage sensed exceeds a selected threshold.

21. A static and monolithic current limiter and circuit-breaker component that connects between a first terminal and a second terminal, the component comprising:
 a one-way conduction current limiter;
 a voltage sensor that senses a voltage between the first and second terminals; and
 means for inhibiting conduction of the current limiter when the voltage sensed exceeds a selected threshold; and
 wherein the voltage sensor is a voltage divider connected between the first and second terminals, wherein the voltage divider includes two N-channel MOS depletion transistors connected in series between the first and second terminals, wherein the current limiter includes an N-channel MOS depletion transistor, and a bipolar NPN transistor having a base, a transmitter and a collector connected to the base via the N-channel MOS depletion transistor, and wherein the inhibition means is formed by an N-channel MOS enhancement transistor connected between the base and the transmitter of the NPN transistor.

* * * * *

UNITED STATES PATENT AND TRADEMARK OFFICE
CERTIFICATE OF CORRECTION

PATENT NO. : 5,903,028
DATED : May 11, 1999
INVENTOR(S) : Jean-Baptiste QUOIRIN, Jean-Louis SANCHEZ and Jean JALLADE It is certified that error appears in the above-indentified patent and that said Letters Patent is hereby corrected as shown below:

Col. 4, line 58, should read:
   FIG. 6B shows an example of an embodiment of the circuit Col. 5, lines 3-7 should read:
   includes, contiguous to region 18, a p- region 27 and a p region 28. p-region 27 is topped by a gate insulation region 29. A metallization M5 is in contact with region 28 and extends over gate insulation region 29. Thus, regions 18, 27 and 28 from a MOS depletion transistor, the substrate of Signed and Sealed this Twenty-third Day of November, 1999

Attest:

Q. TODD DICKINSON

*Attesting Officer*          *Acting Commissioner of Patents and Trademarks*

UNITED STATES PATENT AND TRADEMARK OFFICE
CERTIFICATE OF CORRECTION

PATENT NO. : 5,903,028　　　　　　　　　　　　　　　　　　Page 1 of 1
DATED : May 11, 1999
INVENTOR(S) : Jean-Baptiste Quoirin, Jean-Louis Sanchez and Jean Jallade It is certified that error appears in the above-identified patent and that said Letters Patent is hereby corrected as shown below:

Column 5,
Lines 3-7, should read:

includes, contiguous to region 18, a P⁻ region 27 and a P region 28. P⁻ region 27 is topped by a gate insulation region 29. A metallization M5 is in contact with region 28 and extends over gate insulation region 29. Thus, regions 18, 27 and 28 form a MOS depletion transistor, the substrate of Signed and Sealed this Eighteenth Day of December, 2001

Attest:

JAMES E. ROGAN
Attesting Officer　　Director of the United States Patent and Trademark Office